United States Patent
Jeon

(10) Patent No.: US 9,054,276 B2
(45) Date of Patent: Jun. 9, 2015

(54) SEMICONDUCTOR LIGHT-EMITTING DEVICE

(75) Inventor: Soo Kun Jeon, Gyeonggi-do (KR)

(73) Assignee: SEMICON LIGHT CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/409,391

(22) Filed: Mar. 1, 2012

(65) Prior Publication Data

US 2012/0223357 A1    Sep. 6, 2012

(30) Foreign Application Priority Data

Mar. 3, 2011   (KR) .................. 10-2011-0018979

(51) Int. Cl.
| | | |
|---|---|---|
| *H01L 33/00* | (2010.01) | |
| *H01L 33/38* | (2010.01) | |
| *H01L 33/14* | (2010.01) | |
| *H01L 33/42* | (2010.01) | |
| *H01L 33/20* | (2010.01) | |

(52) U.S. Cl.
CPC ............... *H01L 33/38* (2013.01); *H01L 33/145* (2013.01); *H01L 33/42* (2013.01); *H01L 33/20* (2013.01)

(58) Field of Classification Search
CPC ............ H01L 33/145; H01L 21/02458; H01L 33/405; H01L 33/42; H01L 2924/12041; H01L 33/38; H01L 33/20; G01B 11/303; G01N 2021/8845; G01N 2021/8887; G01N 2021/9518; G01N 21/9515; G09F 3/12

USPC ................ 257/91, 98–99, 96, 13, 79, 743, 76
See application file for complete search history.

(56) References Cited

U.S. PATENT DOCUMENTS

| | | | |
|---|---|---|---|
| 5,300,791 A | | 4/1994 | Chen et al. |
| 5,744,828 A | | 4/1998 | Nozaki et al. |
| 6,121,635 A | * | 9/2000 | Watanabe et al. ............... 257/91 |
| 7,829,909 B2 | * | 11/2010 | Yoo .................. 257/99 |
| 8,395,263 B2 | * | 3/2013 | Sato et al. ................. 257/745 |
| 8,569,735 B2 | * | 10/2013 | Hiraiwa et al. ................. 257/13 |
| 2005/0087884 A1 | * | 4/2005 | Stokes et al. ................. 257/778 |
| 2007/0284593 A1 | * | 12/2007 | Ko et al. ................. 257/79 |
| 2007/0290225 A1 | * | 12/2007 | Lee et al. ................. 257/103 |
| 2010/0148189 A1 | * | 6/2010 | Fang et al. ................. 257/79 |
| 2011/0012154 A1 | * | 1/2011 | Okagawa et al. ............... 257/98 |
| 2011/0260196 A1 | * | 10/2011 | Okagawa et al. ............... 257/98 |
| 2013/0056745 A1 | * | 3/2013 | Chen ................. 257/76 |

* cited by examiner

*Primary Examiner* — Mohammed Shamsuzzaman
(74) *Attorney, Agent, or Firm* — Harness, Dickey & Pierce, P.L.C.

(57) ABSTRACT

The present disclosure relates to a semiconductor light-emitting device, which includes: a first semiconductor layer having first conductivity; a second semiconductor layer having second conductivity different from the first conductivity; an active layer disposed between the first semiconductor layer and the second semiconductor layer and generating light by recombination of electrons and holes; a first pad electrode electrically connected to the second semiconductor layer; a high-resistance body partially disposed on the second semiconductor layer; and a branch electrode disposed on the second semiconductor layer, partially extending over the high-resistance body, and electrically connected to the first pad electrode.

5 Claims, 8 Drawing Sheets

US 9,054,276 B2

SEMICONDUCTOR LIGHT-EMITTING DEVICE

CROSS-REFERENCE TO RELATED APPLICATIONS

This application claims the benefit and priority of Korean Patent Application No. 10-2011-0018979, filed Mar. 3, 2011. The entire disclosure of the above application is incorporated herein by reference.

FIELD

The present invention relates generally to a semiconductor light-emitting device, and particularly, to a semiconductor light-emitting device which improves light emission uniformity.

Here, the semiconductor light-emitting device indicates a semiconductor light-emitting device which generates light by recombination of electrons and holes, and its example is a III-nitride semiconductor light-emitting device. The III-nitride semiconductor is made of a compound containing $Al_{(x)}Ga_{(y)}In_{(1-x-y)}N$ ($0 \leq x \leq 1$, $0 \leq y \leq 1$, $0 \leq x+y \leq 1$). Another example is a GaAs semiconductor light-emitting device used for red light emission.

BACKGROUND

This section provides background information related to the present disclosure which is not necessarily prior art.

FIG. 1 is a view showing an example of a conventional III-nitride semiconductor light-emitting device. The III-nitride semiconductor light-emitting device includes a substrate 10 (e.g., sapphire substrate), a buffer layer 20 grown on the substrate 10, an n-type III-nitride semiconductor layer 30 grown on the buffer layer 20, an active layer 40 grown on the n-type III-nitride semiconductor layer 30, a p-type III-nitride semiconductor layer 50 grown on the active layer 40, a current spreading electrode 60 formed on the p-type III-nitride semiconductor layer 50, a p-side pad electrode 70 formed on the current spreading electrode 60, an n-side pad electrode 80 formed on the n-type III-nitride semiconductor layer 30 exposed by mesa-etching the p-type III-nitride semiconductor layer 50 and the active layer 40, and a protective film 90.

The current spreading electrode 60 serves to allow current to be smoothly supplied to the entire p-type III-nitride semiconductor layer 50. The current spreading electrode 60 may be provided almost on the entire surface of the p-type III-nitride semiconductor layer 50 and formed as a light-transmitting conductive film using ITO or Ni and Au or as a reflective conductive film using Ag, for example.

The p-side pad electrode 70 and the n-side pad electrode 80, which are metal electrodes for current supply and external wire bonding, may be made of any one selected from the group consisting of, e.g., Ni, Au, Ag, Cr, Ti, Pt, Pd, Rh, Ir, Al, Sn, In, Ta, Cu, Co, Fe, Ru, Zr, W, and Mo, or a combination thereof.

The protective film 90, which is made of $SiO_2$, can be omitted.

With the large area tendency and high power consumption of the semiconductor light-emitting device, a plurality of electrodes and branch electrodes have been introduced for smooth current spreading in the semiconductor light-emitting device. For example, as the III-nitride semiconductor light-emitting device gets larger (e.g., width×length=1000 μm×1000 μm), the p-side pad electrode 70 and the n-side pad electrode 80 are provided with a branch electrode to improve current spreading. Furthermore, a plurality of the p-side pad electrodes 70 and a plurality of the n-side pad electrodes 80 may be arranged, respectively, for sufficient current supply.

The electrode and the branch electrode, which are electrically connected to each other, are ideally equipotential. But, there is a tendency that current is actually concentrated on the center of the electrode to which current is being applied.

As in the above, when current is concentrated on a local region of the semiconductor light-emitting device, light cannot be uniformly emitted from the entire light emission area of the semiconductor light-emitting device, which degrades characteristics of the semiconductor light-emitting device in the long term.

SUMMARY

The problems to be solved by the present disclosure will be described in the latter part of the detailed description.

This section provides a general summary of the disclosure and is not a comprehensive disclosure of its full scope or all of its features.

According to one aspect of the present disclosure, there is provided a semiconductor light-emitting device which includes: a first semiconductor layer having first conductivity; a second semiconductor layer having second conductivity different from the first conductivity; an active layer disposed between the first semiconductor layer and the second semiconductor layer and generating light by recombination of electrons and holes; a first pad electrode electrically connected to the second semiconductor layer; a high-resistance body partially disposed on the second semiconductor layer; and a branch electrode disposed on the second semiconductor layer, partially extending over the high-resistance body, and electrically connected to the first pad electrode.

The advantageous effects of the present disclosure will be described in the latter part of the detailed description.

DETAILED DESCRIPTION

The present disclosure will now be described in detail with reference to the accompanying drawings.

Figure 1:
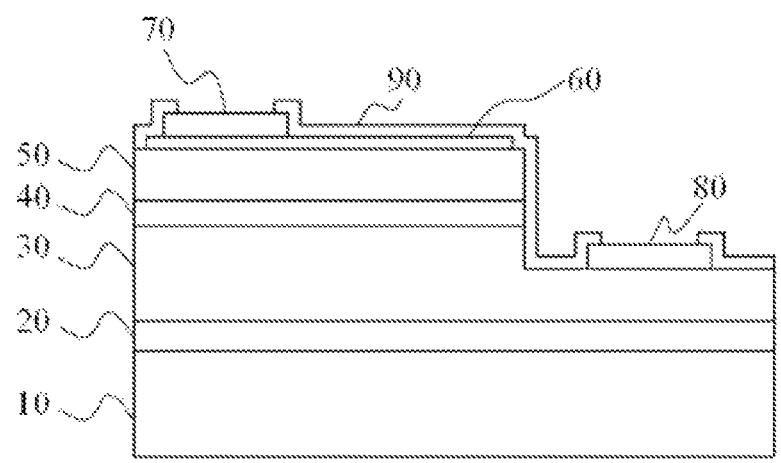
FIG. 1 is a view showing an example of a conventional III-nitride semiconductor light-emitting device.
Figure 2:
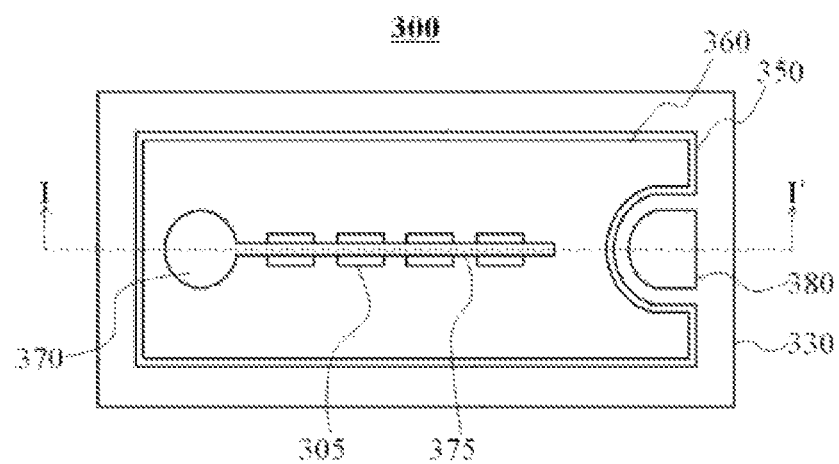
FIG. 2 is a view showing one embodiment of a semiconductor light-emitting device according to the present disclosure.
Figure 3:
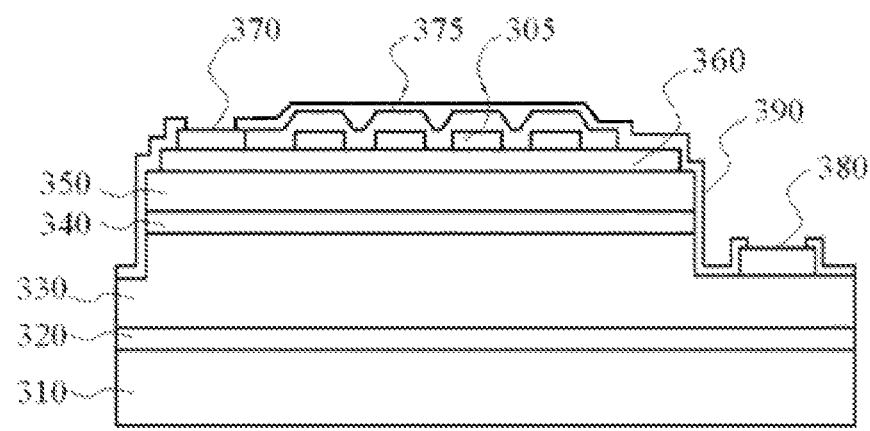
FIG. 3 is a sectional view taken along line I-I' of FIG. 2.

FIG. 2 is a view showing one embodiment of a semiconductor light-emitting device according to the present disclosure, and FIG. 3 is a sectional view taken along line I-I' of FIG. 2.

A semiconductor light-emitting device 300 includes a substrate 310, a buffer layer 320, a first semiconductor layer 330, an active layer 340, a second semiconductor layer 350, a light-transmitting conductive film 360, a first pad electrode 370, a high-resistance body 305, a branch electrode 375, and a second pad electrode 380.

The buffer layer 320, the first semiconductor layer 330, the active layer 340 and the second semiconductor layer 350 are formed on the substrate 310. The semiconductor layers, which are epitaxially grown on the substrate 310, are mostly grown by metal organic chemical vapor deposition (MOCVD). If necessary, each of the semiconductor layers may include sub-layers.

Here, an explanation is made, based on the assumption that the first semiconductor layer 330, the second semiconductor layer 350 and the active layer 340 are made of a III-V compound semiconductor, in particular, a III-nitride semiconductor represented as $Al_{(x)}Ga_{(y)}In_{(1-x-y)}N$ ($0 \leq x \leq 1$, $0 \leq y \leq 1$, $0 \leq x+y \leq 1$).

With regard to the substrate 310, a GaN-based substrate can be used as a homo-substrate, and a sapphire substrate, an SiC substrate or an Si substrate can be used as a hetero-substrate. However, any type of substrate may be employed as far as it can have a III-nitride semiconductor layer grown thereon.

The first semiconductor layer 330 and the second semiconductor layer 350 are provided with different conductivity. In the present disclosure, the first semiconductor layer 330 is an n-type nitride semiconductor layer 330 (e.g., n-type GaN layer), while the second semiconductor layer 350 is a p-type nitride semiconductor layer 350 (e.g., p-type GaN layer). Additionally, the first pad electrode 370 is a p-side pad electrode 370, while the second pad electrode 380 is an n-side pad electrode 380, for example.

Then, the n-type nitride semiconductor layer 330 is exposed by mesa-etching the p-type nitride semiconductor layer 350 and the active layer 340. A dry etching method, e.g., an inductively coupled plasma (ICP) method may be employed to remove a few semiconductor layers.

Next, as illustrated in FIGS. 2 and 3, the light-transmitting conductive film 360 is provided almost on the entire surface of the p-type nitride semiconductor layer 350 using sputtering, E-beam evaporation, thermal evaporation, etc. The light-transmitting conductive film 360 serves to improve light uniformity. The light-transmitting conductive film 360 is mostly made of an ITO or Ni/Au oxide film. If the light-transmitting conductive film 360 is too thin, it is disadvantageous in current spreading, which leads to a high driving voltage, and if the light-transmitting conductive film 360 is too thick, it absorbs light, which leads to reduced light extraction efficiency.

Then, the high-resistance body 305 is formed on part of the light-transmitting conductive film 360 using plasma enhanced chemical vapor deposition (PECVD), low pressure chemical vapor deposition (LPCVD), sputtering, E-beam evaporation, thermal evaporation, etc. Preferably, the high-resistance body 305 is made of a material with a lower refractive index than a material which it contacts (i.e., the light-transmitting conductive film 360 in the present disclosure). For example, the high-resistance body 305 may be made of any one selected from, e.g., $SiO_2$, SiN, $AlO_x$, SiON, and $TiO_2$.

The semiconductor light-emitting device 300 may extend in one direction for size increase. FIG. 2 shows a case in which the semiconductor light-emitting device 300 is formed generally in a rectangular shape. Therefore, still referring to FIG. 2, the semiconductor light-emitting device 300 may have long sides and short sides, and the high-resistance body 305 may be arranged in an island shape to correspond to the branch electrode 375, which will be formed later.

After the formation of the high-resistance body 305, the n-side pad electrode 380, the p-side pad electrode 370 and the branch electrode 375 are formed using sputtering, E-beam evaporation, thermal evaporation, etc. The n-side pad electrode 380, the p-side pad electrode 370 and the branch electrode 375 may be formed by stacking, e.g., Cr, Ni and Au.

The n-side pad electrode 380 is formed on the n-type nitride semiconductor layer 330, while the p-side pad electrode 370 is formed on the light-transmitting conductive film 360. Alternatively, the p-side pad electrode 370 may be brought into contact with the p-type nitride semiconductor layer 350 by removing part of the light-transmitting conductive film 360 to enhance the adhesion.

For example, as illustrated in FIG. 2, the n-side pad electrode 380 and the p-side pad electrode 370 lie on the opposite short sides, and the branch electrode 375 extends from the p-side pad electrode 370 toward the n-side pad electrode 380. The shape and arrangement of the n-side pad electrode 380, the p-side pad electrode 370 and the branch electrode 375 shown in FIGS. 2 and 3 may be changed in various ways. As illustrated in FIG. 3, the branch electrode 375 extends over the high-resistance body 305. Accordingly, the branch electrode 375 alternately comes into contact with the light-transmitting conductive film 360 and the high-resistance body 305.

Current applied through the p-side pad electrode 370 is spread through the branch electrode 375 and the light-transmitting conductive film 360. The high-resistance body 305 may be made of an insulating material. Since the high-resistance body 305 has a resistance high enough to intercept current, the current, which flows through the branch electrode 375, flows through the light-transmitting conductive film 360 only in a section where it contacts the light-transmitting conductive film 360. As compared with a case in which there is no high-resistance body 305, when the high-resistance body 305 is placed under the branch electrode 375 as in the present disclosure, there is an advantage in current spreading since the current can flow uniformly through the entire branch electrode 375, as a result of which light emission uniformity can be improved.

ITO of the light-transmitting conductive film 360 has a refractive index of about 1.8 to 2.0, while $SiO_2$ of the high-resistance body 305 has a refractive index of about 1.5. Therefore, light generated in the active layer 340 and incident on the light-transmitting conductive film 360 is not absorbed by the branch electrode 375 but reflected from the interface between the light-transmitting conductive film 360 and the high-resistance body 305, which improves light extraction efficiency.

The thickness of the high-resistance body 305 may affect light reflection efficiency. To effectively reflect light, the high-resistance body 305 may have a thickness ranging from 3000 Å to 20000 Å.

If the width of the high-resistance body 305 is too large, light generated in the active layer 340 and incident on the high-resistance body 305 is excessively reflected back to the substrate 310, and if the width of the high-resistance body 305 is too small, an effect of the high-resistance body 305 intercepting current to improve current spreading uniformity is reduced. It is thus preferable that the width of the high-resistance body 305 should be equal to or slightly larger than the width of the branch electrode 375.

Figure 4:
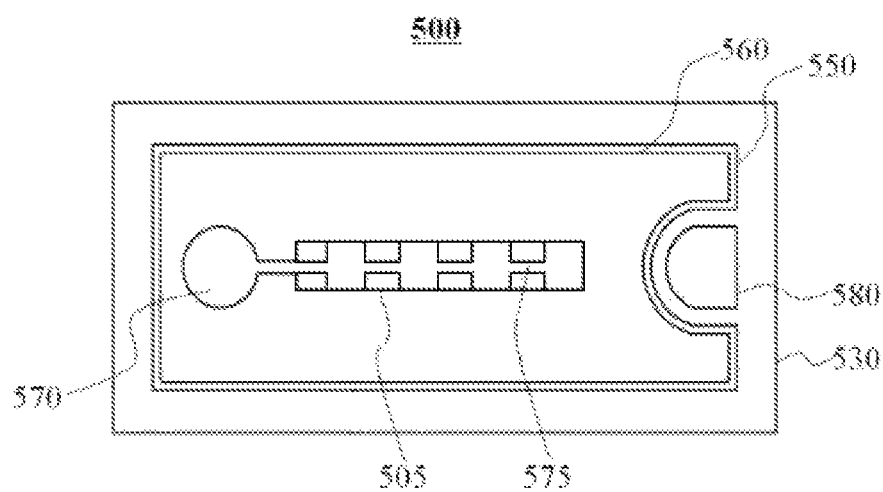
FIG. 4 is a view showing another embodiment of a semiconductor light-emitting device according to the present disclosure.

FIG. 4 is a view showing another embodiment of a semiconductor light-emitting device according to the present disclosure.

A semiconductor light-emitting device 500 is substantially identical to the semiconductor light-emitting device 300 shown in FIGS. 2 and 3 except that a branch electrode 575 has a different shape. Duplicate description thereof will be omitted, and same or similar reference numbers refer to same components.

Referring to FIG. 4, the width of the branch electrode 575 on a light-transmitting conductive film 560 is larger than the width of the branch electrode 575 on a high-resistance body 505. Therefore, the branch electrode 575 alternately has wide parts and narrow parts, wherein the high-resistance body 505 is disposed under the narrow parts and the light-transmitting conductive film 560 is disposed under the wide parts. As described above, the area of the branch electrode 575 increases in the region in which the branch electrode 575 and the light-transmitting conductive film 560 are brought into contact with each other, which makes it possible to prevent the contact area between the branch electrode 575 and the light-transmitting conductive film 560 from being excessively reduced due to the high-resistance body 505. As a result, current spreading can be facilitated.

Figure 5:
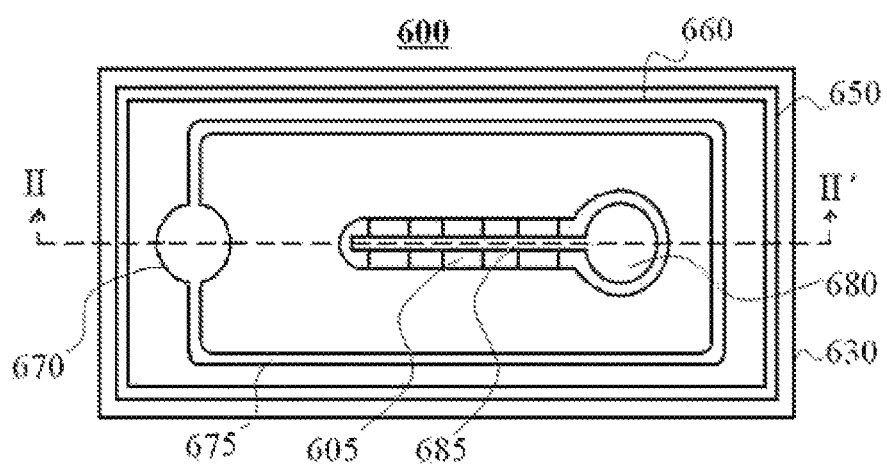
FIG. 5 is a view showing a further embodiment of a semiconductor light-emitting device according to the present disclosure.
Figure 6:
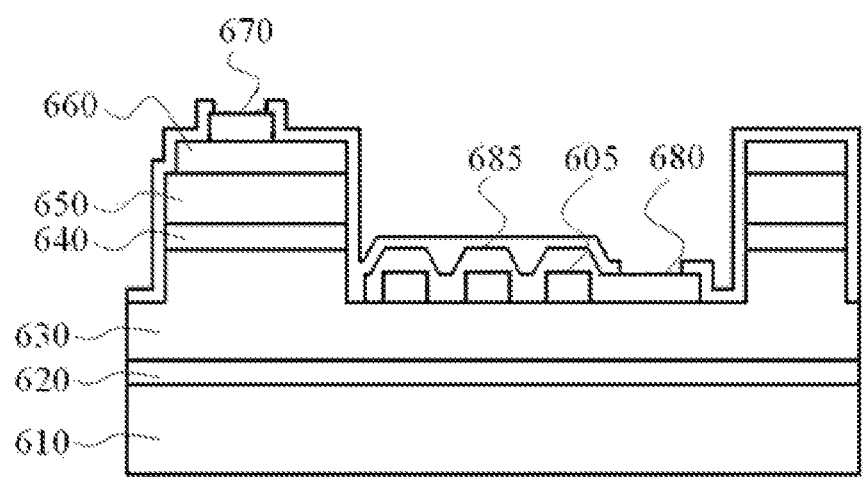
FIG. 6 is a sectional view taken along line II-II' of FIG. 5.

FIG. 5 is a view showing a further embodiment of a semiconductor light-emitting device according to the present disclosure, and FIG. 6 is a sectional view taken along line II-II' of FIG. 5.

A semiconductor light-emitting device 600 is substantially identical to the semiconductor light-emitting device 300 shown in FIGS. 2 and 3 except that a high-resistance body 605 is removed from a p-type nitride semiconductor layer 650 and formed on an n-type nitride semiconductor layer 630. Duplicate description thereof will be omitted, and same or similar reference numbers refer to same components.

Referring to FIGS. 5 and 6, the n-type nitride semiconductor layer 630 is exposed by mesa-etching the p-type nitride semiconductor layer 650 and an active layer 640. The exposed region of the n-type nitride semiconductor layer 630 corresponds to an n-side pad electrode 680 and an n-side branch electrode 685.

A high-resistance body 605 is arranged in an island shape on the exposed n-type nitride semiconductor layer 630. A branch electrode 685 extends from the n-side pad electrode 680 toward a p-side pad electrode 670 on the n-type nitride semiconductor layer 630 and also extends over the high-resistance body 605.

The p-side pad electrode 670 is disposed on the p-type nitride semiconductor layer 650, opposite to the n-side pad electrode 680, and a p-side branch electrode 675 extends along the edge of the light emission region.

The n-type nitride semiconductor layer 630 may be made of n-type GaN, while the p-type nitride semiconductor layer 650 may be made of p-type GaN. The n-type nitride semiconductor layer 630 is more effective in current spreading than the p-type nitride semiconductor layer 650. Accordingly, the high-resistance body 605 disposed on the n-type nitride semiconductor layer 630 of the semiconductor light-emitting device 600 shown in FIGS. 5 and 6 not only contributes to current spreading but also assists in preventing light from being absorbed by the branch electrode 685.

Figure 7:
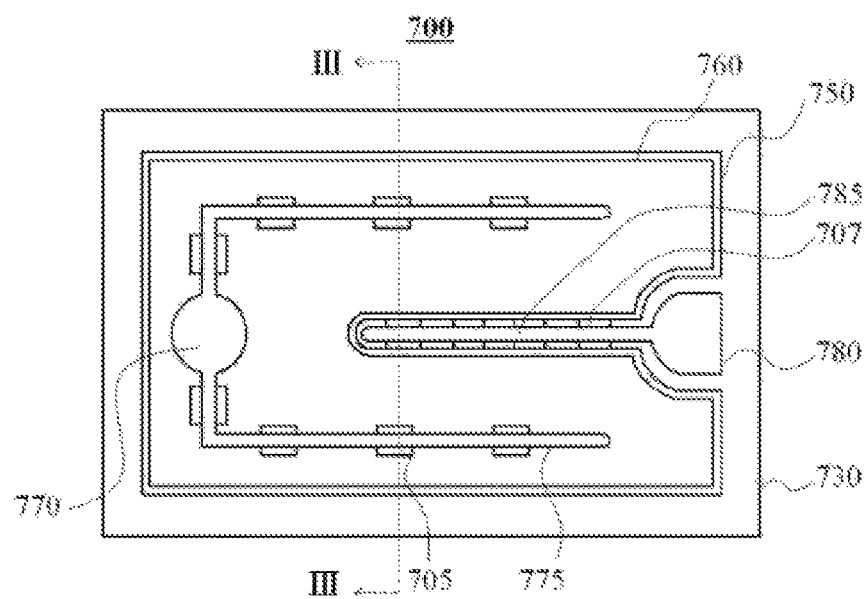
FIG. 7 is a view showing a still further embodiment of a semiconductor light-emitting device according to the present disclosure.
Figure 8:
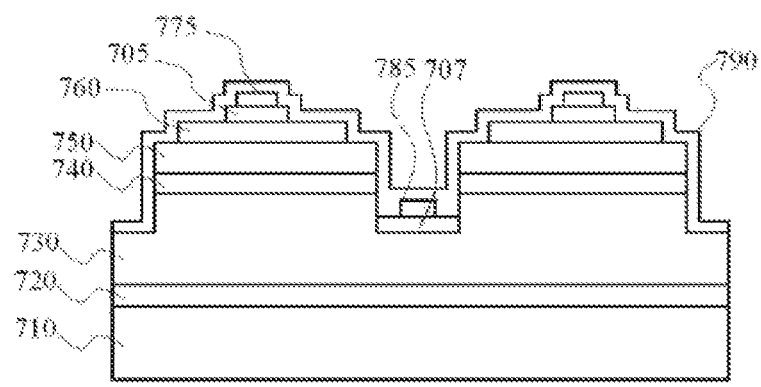
FIG. 8 is a sectional view taken along line III-III' of FIG. 7.

FIG. 7 is a view showing a still further embodiment of a semiconductor light-emitting device according to the present disclosure, and FIG. 8 is a sectional view taken along line III-III' of FIG. 7.

A semiconductor light-emitting device 700 is substantially identical to the semiconductor light-emitting device 300 shown in FIGS. 2 and 3 except that a high-resistance body 707 and an n-side branch electrode 785 are also formed on the n-side and a p-side branch electrode 775 has a different shape. Duplicate description thereof will be omitted, and same or similar reference numbers refer to same components.

Referring to FIGS. 7 and 8, a plurality of semiconductor layers are formed on a substrate 710, and then an n-type nitride semiconductor layer 730 is exposed by mesa-etching a p-type nitride semiconductor layer 750 and an active layer 740. Here, the n-type nitride semiconductor layer 730 is exposed in a region corresponding to an n-side pad electrode 780 and the n-side branch electrode 785.

Next, a light-transmitting conductive film 760 is formed on the p-type nitride semiconductor layer 750. Still referring to FIG. 7, a high-resistance body 705 is arranged in an island shape in a region in which the p-side branch electrode 775 is to be formed on the light-transmitting conductive film 760. In addition, the high-resistance body 707 may be arranged in an island shape on the n-type nitride semiconductor layer 730, on which the n-side branch electrode 785 is to be formed.

Thereafter, the n-side pad electrode 780, the n-side branch electrode 785, a p-side pad electrode 770, and the p-side branch electrode 775 are formed. The n-side branch electrode 785 runs generally along the center of the light emission region and extends over the high-resistance body 707. The n-side branch electrode 785 is alternately brought into contact with the n-type nitride semiconductor layer 730 and the high-resistance body 707. The p-side branch electrode 775 runs along the short side, is curved, and runs along the long side toward both sides of the n-side branch electrode 785, while extending over the high-resistance body 705. The p-side branch electrode 775 alternately comes into contact with the p-type nitride semiconductor layer 750 and the high-resistance body 705.

As a result, the high-resistance bodies 705 and 707 serve to reduce current concentration, facilitate current spreading as described above, interrupt light absorption by the branch electrode, and improve light extraction efficiency.

Various embodiments of the present disclosure will now be described.

(1) A semiconductor light-emitting device, wherein the branch electrode extends to be alternately disposed on the second semiconductor layer and the high-resistance body.

(2) A semiconductor light-emitting device, wherein the width of the branch electrode on the second semiconductor layer is larger than the width of the branch electrode on the high-resistance body.

(3) A semiconductor light-emitting device, wherein the width of the high-resistance body is equal to or larger than the width of the branch electrode.

(4) A semiconductor light-emitting device, wherein the high-resistance body is made of at least one selected from the group consisting of $SiO_2$, $SiN$, $AlO_x$, $SiON$, and $TiO_2$.

(5) A semiconductor light-emitting device, wherein the high-resistance body is arranged as a plurality of islands along the branch electrode.

(6) A semiconductor light-emitting device, further comprising: a light-transmitting conductive film which is formed generally over the second semiconductor layer and on which the high-resistance body and the branch electrode are disposed; and a second pad electrode which is disposed on the first semiconductor layer exposed by mesa-etching the second semiconductor layer and the active layer.

A semiconductor light-emitting device according to the present disclosure includes a case in which the second pad electrode is omitted and the n-type nitride semiconductor layer is directly electrically bonded on a lead electrode.

(7) A semiconductor light-emitting device, further comprising: a light-transmitting conductive film formed generally over the first semiconductor layer; and a second pad electrode disposed on the light-transmitting conductive film, wherein the first pad electrode, the high-resistance body and the branch electrode are disposed on the second semiconductor layer exposed by mesa-etching the first semiconductor layer and the active layer.

(8) A semiconductor light-emitting device, further comprising: a light-transmitting conductive film formed generally over the second semiconductor layer and disposed under the first pad electrode and the branch electrode; a second pad electrode disposed on the first semiconductor layer exposed by mesa-etching the second semiconductor layer and the active layer; an additional high-resistance body partially disposed on the first semiconductor layer; and an additional branch electrode partially extending over the additional high-resistance body on the first semiconductor layer and electrically connected to the second pad electrode.

(9) A semiconductor light-emitting device, wherein the additional branch electrode on the first semiconductor layer extends toward the first pad electrode and the branch electrode on the second semiconductor layer extends along the edge of the semiconductor light-emitting device.

A semiconductor light-emitting device according to the present disclosure improves light emission uniformity since current is more uniformly spread due to a high-resistance body under a branch electrode.

A semiconductor light-emitting device according to the present disclosure improves light extraction efficiency since a high-resistance body reflects light so that light absorption by a branch electrode can be reduced.

What is claimed is:

1. A semiconductor light-emitting device, comprising:
    a first semiconductor layer having first conductivity;
    a second semiconductor layer having second conductivity different from the first conductivity;
    an active layer disposed between the first semiconductor layer and the second semiconductor layer and generating light by recombination of electrons and holes;
    a first pad electrode electrically connected to the second semiconductor layer;
    a branch electrode which extends from the first pad electrode;
    a light-transmitting conductive film which is formed under the branch electrode, wherein the branch electrode is disposed on the light-transmitting conductive film in a manner that the branch electrode is not disposed between the first pad electrode and the light-transmitting conductive film;
    an insulating body disposed between the branch electrode and the second semiconductor layer, wherein the branch electrode extends from the first pad electrode over the insulating body and wherein the branch electrode partially covers the insulating body; and
    wherein in a plan view the insulating body is arranged as plurality of islands along a length of the branch electrode outwardly and a thickness of the insulating body ranging from 3000 Å to 20000 Å.

2. The semiconductor light-emitting device as claimed in claim 1, wherein the branch electrode extends to be alternately disposed on the light-transmitting conductive film and the insulating body.

3. The semiconductor light-emitting device as claimed in claim 2, wherein a width of the insulating body is equal to or larger than a width of the branch electrode.

4. The semiconductor light-emitting device as claimed in claim 2, wherein the insulating body is made of at least one selected from the group consisting of $SiO_2$, SiN, $AlO_x$, SiON, and $TiO_2$.

5. The semiconductor light-emitting device as claimed in claim 1, further comprising:
    a second pad electrode which is disposed on the first semiconductor layer exposed by mesa-etching the second semiconductor layer and the active layer.

* * * * *